United States Patent [19]

Heichler

[11] Patent Number: 4,932,029
[45] Date of Patent: Jun. 5, 1990

[54] METHOD AND APPARATUS FOR CORRECTING ERRORS IN CONVOLUTIONAL CODE SIGNALS

[75] Inventor: Johannes Heichler, Murrhardt, Fed. Rep. of Germany

[73] Assignee: ANT Nachrichtentechnik GmbH, Backnang, Fed. Rep. of Germany

[21] Appl. No.: 223,948

[22] Filed: Jul. 25, 1988

[30] Foreign Application Priority Data

Jul. 24, 1987 [DE] Fed. Rep. of Germany ....... 3724537
Jul. 24, 1987 [DE] Fed. Rep. of Germany ....... 3724536
Aug. 3, 1987 [DE] Fed. Rep. of Germany ....... 3725655

[51] Int. Cl.$^5$ ............................................. G06F 11/00
[52] U.S. Cl. ......................................... 371/43; 371/5.3
[58] Field of Search .................... 371/43, 44, 45, 46, 371/5, 5.1, 5.3

[56] References Cited

U.S. PATENT DOCUMENTS

| | | | |
|---|---|---|---|
| 3,891,959 | 6/1975 | Tsuji ...................................... | 371/43 |
| 4,483,012 | 11/1984 | Wei ...................................... | 371/43 X |
| 4,566,100 | 1/1986 | Mizuno ................................. | 371/5 |
| 4,675,871 | 6/1987 | Gordon ............................... | 371/43 X |
| 4,757,506 | 7/1988 | Heichler .............................. | 371/43 |

FOREIGN PATENT DOCUMENTS

52463A1  4/1981  European Pat. Off. .............. 371/43

OTHER PUBLICATIONS

Orndorff et al., "Viterbi Decoder VLSI Integrated Circuit for Bit Error Correction", NTC'81, vol. 3.
Proc. of IEEE, vol. 61, #3, Mar. 1973, (pp. 263–277).

Primary Examiner—John R. Lastova
Assistant Examiner—Robert W. Beausoliel
Attorney, Agent, or Firm—Spencer & Frank

[57] ABSTRACT

A method and apparatus for correcting errors in convolutional code signals prior to Viterbi decoding. Branch metrics in the decoding of n-PSK convolution code signals are used to obtain a differential metric with calculations in both the logical and arithmetic domain. The differential metric is used to obtain a phase error signal which includes information on the quality of the convolution code signals, and control signals for the resolution of phase ambiguity in the demodulation of the convolution code signals are obtained using the phase error signal, such that an improvement in the bit error rate and synchronization is made possible, in particular in decoders for error-correctable convolution code signals. The phase error signal is produced when, over a predetermined time period the differential metric is less than a given threshold value or is decreasing, so as to indicate an error in the demodulated convolution signal over such time period and therefore the probable presence of a phase error. The phase error signals are used to estimate the presence and direction of phase angle jumps in the modulation carrier by formation of the difference between current and previously ascertained values of the phase angle, starting of a counter for upward counting of the binary value of the signal whenever the phase angle jump direction is positive, starting of this counter for downward counting of the binary value whenever the phase angle jump direction is negative, and emission of the counter state in the form of a control signal.

18 Claims, 11 Drawing Sheets

FIG. 3a

| FAIL: | NO "FAIL" | "FAIL" | NO "FAIL" |
|---|---|---|---|
| REG I: | SAME STATE AS CNT | HOLDS PREVIOUS STATE OF CNT PRIOR TO FAIL SIGNAL | SAME STATE AS CNT |
| CNT: | STATE AT END OF PREVIOUS FAIL SIGNAL | COUNTS WITH CL' INPUT FROM TIME DIVIDER STT IN DIRECTION DETERMINED BY REG II STATE | STATE AT END OF FAIL SIGNAL = CORRECT STATE FOR PROPER PHASE ADJUSTMENT AS DETERMINED BY ACS - CIRCUIT, DELTA - M STAGE AND PHASE ERROR DETERMINING STAGE (SEE FIG. 1) |
| SUB: | "0" | COUNT FROM CNT LESS CURRENT STATE OF REG I | "0" |
| BG: | STATE AT END OF PREVIOUS FAIL SIGNAL. ("0" INPUT FROM SUB OVERRIDDEN BY FEEDBACK FROM REG II) | NEW UP/DOWN STATE:<br>INPUT FROM SUB — STATE / CURRENT REG I STATE<br>0 OR 2 — UP<br>1<br>3 — DOWN | STATE AT END OF FAIL SIGNAL |
| REG II: | SAME STATE AS BG (FED BACK TO OVERRIDE "0" INPUT TO BG FROM SUB) | HOLDS PREVIOUS STATE OF BG PRIOR TO FAIL SIGNAL | SAME STATE AS BG (ONLY CHANGES AT END OF FAIL SIGNAL) |

METHOD AND APPARATUS FOR CORRECTING ERRORS IN CONVOLUTIONAL CODE SIGNALS

BACKGROUND OF THE INVENTION

The invention relates to a method of correcting errors in convolutional code signals and to an apparatus for performing the method, and more particularly to a method and apparatus for evaluating branch metrics in the decoding of n-PSK convolution code signals, obtaining a phase error signal which includes information on the quality of the convolution code signals, with the use of the branch metrics, obtaining control signals for the resolution of phase ambiguity in the demodulation of the convolution code signals.

In convolutional code signal decoding, for example by means of a Viterbi decoder, in principle data from a PSK demodulator are made available, the number of data streams depending in a known manner on the number of phase coding statuses. For example, in QPSK modulation, it is two. In this case, two data streams for each one bit are obtained at the output of the demodulator, these data streams inherently having interference such as noise, amplitude errors, and so forth.

However, there are still other possible kinds of interference, which do not have to do with the quality of reception at the time but instead are intrinsic in the system: that is, phase ambiguity, which is associated with the carrier recovery in the demodulator. Phase errors for QPSK Modulation is expressed in the data stream in such a way that (a) with 180° errors, both bits appear in inverted form, (b) with +90° errors, one bit appears in inverted form and both appear transposed with one another, (c) with −90° errors the other bit appears in inverted form and both appear transposed with one another.

From European Patent No. 52 463 A1, it is known in principle to distinguish invalid transitions in the trellis diagram, resulting from noise or phase ambiguity, by means of a phase ambiguity detector.

For synchronization in decoders for convolution code signals, signals must be available that furnish information on phase errors that occur. To resolve phase ambiguity by means of a phase ambiguity detector in QAM or QPSK transmission of error-correcting convolution code signals, such phase error signals are also required; see European Patent No. 52 463 A1, for instance.

In the decoding of error-correcting convolutional code signals, in particular in Viterbi decoding in accordance with the trellis diagram, so-called ACS (add-compare-select) networks are necessary for evaluating the branch metrics and ascertaining the path metrics. From the Proceedings of the IEEE, Vol. 61, No. 3, March 1973, pages 268–277, in particular page 273, it is known to assemble such ACS arithmetic units from parallel-functioning comparison stages and selection stages.

From NTC 1981, Vol. 3, pages E1.7.1-E1.7.4, it is known to assemble an ACS network for a Viterbi decoder from two adders each, one comparator, one selection stage and one register, for evaluating the branch metrics and obtaining the path metric.

U.S. Pat. No. 4,757,506, the disclosure of which is incorporated herein by reference, discloses two further alternatives for ACS networks—first, an ACS network with processing in the logical operation domain (FIG. 5), that is, representation of a binary number as a position of a logical state in a line of $2^n$, where n is the place number of the binary number, and second, a substantially arithmetically functioning ACS network (FIG. 6).

SUMMARY OF THE INVENTION

It is an object of the invention to provide a method and an apparatus for obtaining a phase error signal which includes information on the quality of a convolution code signal, such that an improvement in the bit error rate in synchronization is made possible, in particular in decoders for error-correctable convolution code signals. This object is attained by and with the use of a circuit for forming a differential metric based on the difference between a minimum and a maximum path metric of the convolution code signal, determining whether the differential metric exceeds a first threshold value and the algebraic sign of a change in the differential metric, producing a first error signal each time the differential metric is below the first threshold value or the algebraic sign of the change in the differential metric is negative, counting the first error signals for a predetermined continuous period of time, and producing a second error signal representing a determination of a phase error if a predetermined number of the first error signals are counted during the predetermined continuous period of time.

The advantages of the invention are attained in particular because errors in synchronization are unequivocally recognizable, and fewer possibilities for error arise in a phase ambiguity resolution dependent on the phase error signal obtained. For evaluation, the difference between the minimum and maximum path metric is utilized directly, because it is an unequivocal criterion for the current quality of the received convolution code signal. By means of the method steps according to the invention, it is assured that the phase error signal will with great probability occur only whenever a genuine phase error is present. By adaptation to channel conditions, reliable synchronization results.

It is another object of the invention to disclose a method, for the preparation of control signals for resolution of phase ambiguity in the demodulation of n-PSK signals, which reliably recognizes a phase ambiguity and enables an adaptive correction. Furthermore, the invention is also directed to an apparatus for performing this method and a usage of the apparatus.

In terms of the method, this object is attained by encoding of the n-PSK signal in such a manner that the binary value of the signal bits are proportional to the phase angle of the bits; ascertainment of the phase angle jump direction by formation of the difference between a current value of the phase angle and a previously ascertained value of the phase angle; starting of a counter for upward counting of the binary value of the signal whenever the phase angle jump direction is positive; starting of this counter for downward counting of the binary value whenever the phase angle jump direction is negative; and emission of the counter state in the form of a control signal.

An apparatus for performing this method includes a counter having an ENABLE input for delivering a phase error signal and a clock input for subjection to a subdivided system clock. The apparatus also includes a first memory having a data input for the output signals of the counter and a DISABLE input for delivering the phase error signal; a subtractor having a first data input for delivery of the output signals of the counter and a second data input for delivery of the output signals of the first memory; a command logic circuit having an address control input for the output signals of the subtractor and a data input for the delivery of command instructions, these instructions encompassing the upward counting and downward counting of the counter and the maintaining of the previously ascertained value upon a phase jump difference of 180°. Additionally provided is a second memory having a data input for the output signals of the command transducer, a DISABLE input for delivery of the phase error signal and a data output which is connected to the counting direction control input of the counter. A control signal output for emission of the counter state of the counter is also provided.

The apparatus can be used for controlling a transformation network at the digital input of a convolution decoder, which cancels the phase ambiguity appearing at the carrier recovery. The invention has the advantage in particular that the bit error rate in the synchronization during the decoding of convolutional code signals is improved by means of an adaptive correction mode. Furthermore, in the method according to the invention control signals are obtained that are not derived from an estimation process, as for instance in the method of European Patent No. 52 463 81. The reliability of the control signals is therefore very high, and the correction time is very short.

It is still another object of the invention to provide a method for evaluation of the branch metrics in the decoding of convolutional signals, in such a way that fast information processing is possible. A further object of the invention is to provide an apparatus for performing the method.

These objects are attained in accordance with the method and apparatus of the invention, in which branch metrics are evaluated such that for each of a plurality of memories, one of two opposed respective current branch metrics is added at a time in the arithmetic domain to a prior sum in a corresponding one of the memories to obtain a corresponding decision (a sum), as by an adder, respective pairs of the branch metrics comprising two opposed ones of the branch metric (R11 and R00, or R10 and R01). The decisions are then transformed as by multiplexers from the arithmetic domain to the logical domain, the transformed decisions of respective pairs of the transformed decisions deriving from respective pairs of opposed branch metrics ar compared as by AND linking stages, in the logical domain. The minimum metric is then selected for each of the respective pairs of transformed decisions, as by priority encoders, the minimum metric being one of the least significant bit position and the most significant bit position determined from each comparison of the transformed decisions during the comparison of the transformed decisions of respective pairs of the transformed decisions. The minimum metrics selected during selection of the minimum metric for each of the respective pairs of transformed decisions are collected as by a multi-AND-linking stage. The overall minimum metric from among the collected minimum metrics and representing either the least significant or the most significant bit position, (depending on the logic process used to represent the minimum metric) is then selected as by a priority encoder. For example, if all 1's are used except a 0 at the N position representing the minimum metric, the least significant bit position having a 0 in the logical representation of the overall minimum metric is selected. This overall minimum metric is then subtracted, as by a subtractor, from each of the minimum metrics selected for each of the respective pairs of transformed decisions. The current branch metrics in the memories are then updated as by an electrical connection with respective ones of the results of the subtraction of the overall minimum metric from each of the minimum metrics. In addition, the decisions obtained by performing additions in the arithmetic domain, of respective pairs of decisions deriving from the respective pairs of opposed branch metrics, are compared, as by threshold detectors, to obtain a path decision datum for each of the respective pairs of decisions used for other purposes on viterbi decoding as disclosed for example in U.S. Pat. No. 4,757,506.

The invention proceeds from the recognition that the previously known methods for branch metrics evaluation, or the circuit apparatus therefor, were based on mathematically sub-optimal processing or allowed only very slow processing, which does not allow ascertaining the actual path metric in real time but instead permits real time evaluation only based on estimated values, or requires very complicated circuitry. The invention permits localizing the minimum metric in the shortest possible time at low circuitry cost; that is, in particular, the number of logical gate stages is reduced. As a result of the fast processing, the differential metric can be detected exactly, which is important particularly in synchronization within Viterbi decoding or in the resolution of a phase ambiguity.

BRIEF DESCRIPTION OF THE DRAWINGS

These and other features and advantages of the invention will be more completely understood from the following description of the preferred embodiment with reference to the accompanying drawings in which:

FIG. 3a shows the reaction of circuit elements of FIG. 3 to a FAIL signal.

DESCRIPTION OF THE PREFERRED EMBODIMENTS

Figure 1:
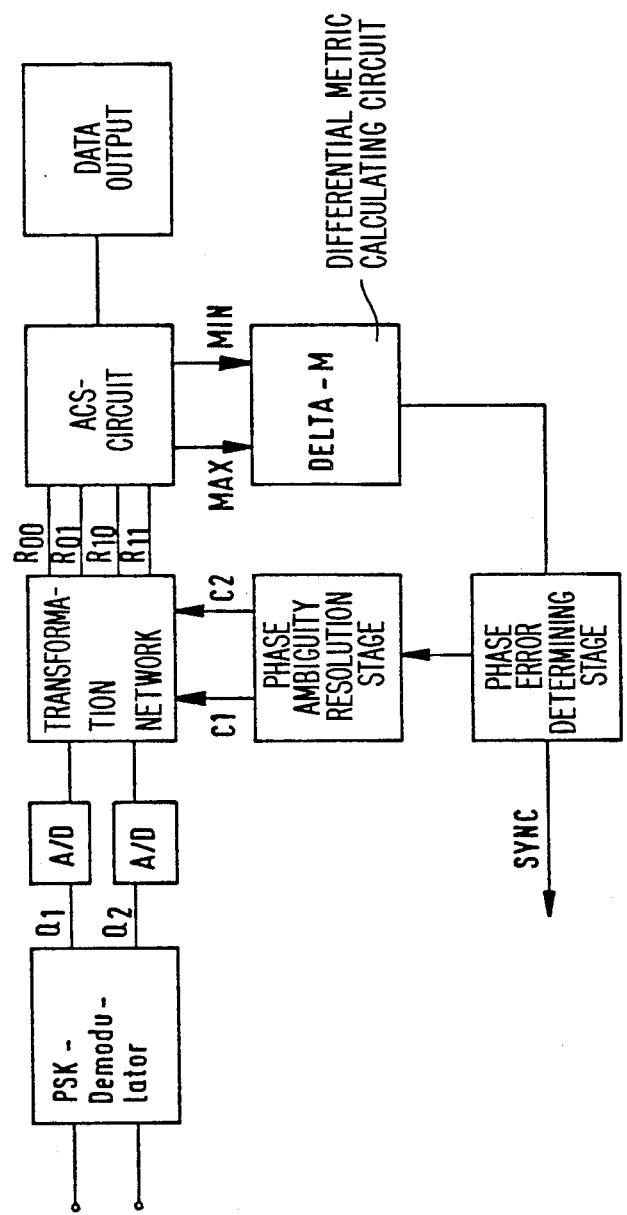
FIG. 1 is an overview circuit diagram of a Viterbi decoder in accordance with the invention.

A PSK demodulator is connected to the input side of the Viterbi decoder of FIG. 1, and in the case of a QPSK modulation emits two data streams Q1 and Q2 for each one bit. These data streams inherently have interference such as noise, amplitude errors, and so forth. However, there are still other possible kinds of interference, which do not have to do with the quality of reception at the time but instead are intrinsic in the system: that is, phase ambiguity, which is associated with the carrier recovery in the demodulator, caused by the fact that the process of demodulation (eliminating the carrier) is not definite (is ambiguous). It is expressed in the data stream in such a way that (a) with 180° errors, both bits appear in inverted form (Q1 appears −Q1, Q2 appears as −Q2), (b) with +90° errors, one bit appears in inverted form and both appear transposed with one another (e.g. Q1 appears as −Q2 and Q2 appears as −Q1). Such errors will remain until corrected.

(c) with −90° errors the other bit appears in inverted form and both appear transposed with one another (e.g. Q1 appears as −Q2 and Q2 appears as −Q1). Such errors will remain until corrected.

Figure 2:
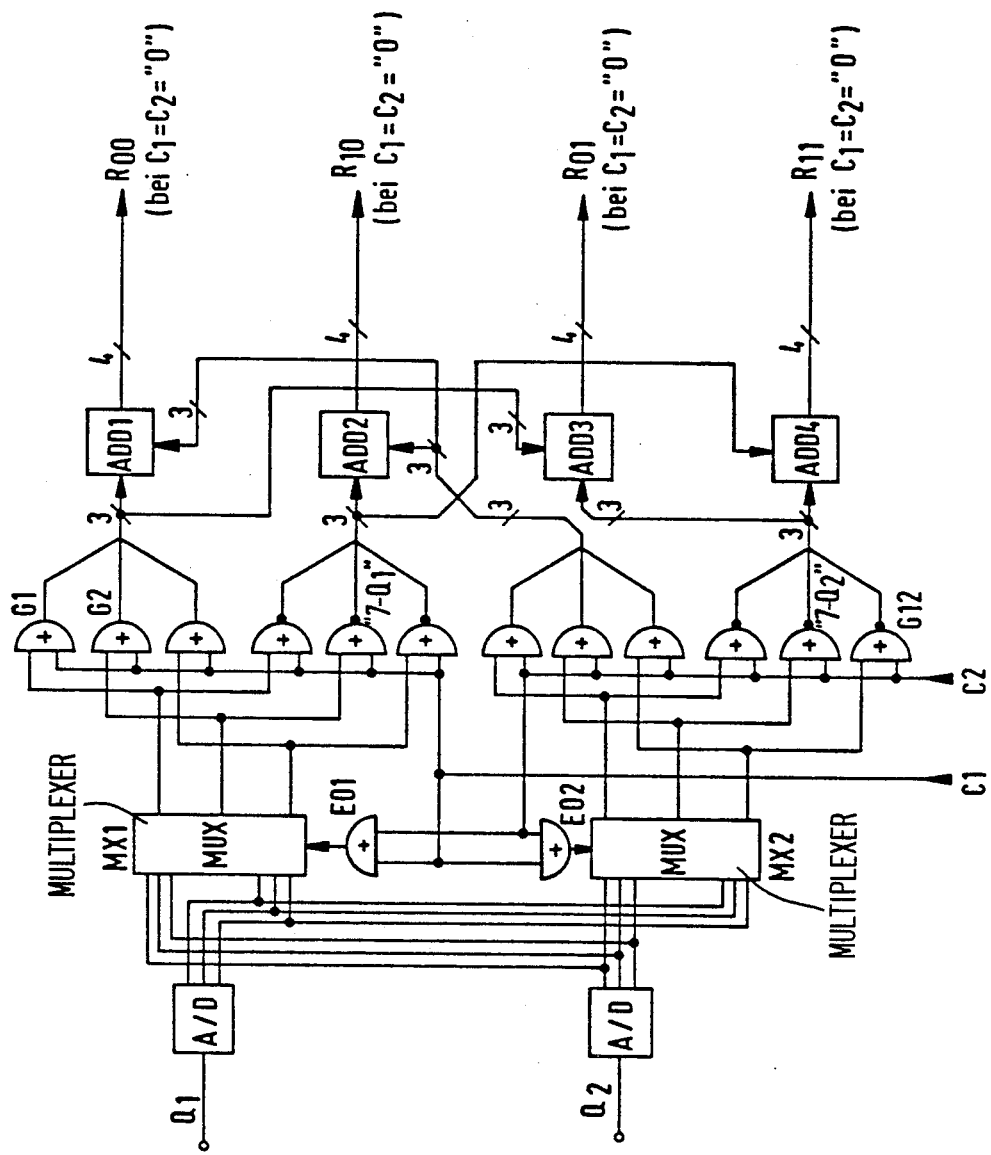
FIG. 2 is a circuit diagram of a transformation network in the Viterbi decoder of FIG. 1.

In order to reverse this transposition and inversion, there is a transformation network at the digital input of the Viterbi decoder—that is, immediately following the A/D converters—which being in the form of a final control element is capable of cancelling or reversing the transposition and inversion. For triggering this final control element, control signals are required. In the example of a QPSK modulation shown here, two control bits C1 and C2 are required as control signals which have values according to the phase angle as below. FIG. 2 shows an example for such a transformation network, which is described at length in Applicant's U.S. Pat. No. 4,757,506 and German Patent No. 36 00 905.9 (but with the distinction that the control signals C1 and C2 were different and required to undergo a code conversion).

| Phase Angle | C1 and C2 |
| --- | --- |
| 0° | 0 0 |
| 90° | 0 1 |
| 180° | 1 0 |
| 270° | 1 1 |

The transformation network includes multiplexers MX1 and MX2 for crosswise channel transposition, which are each controlled via a respective exclusive OR element E01 or E02 by the control bits C1 and C2. The output signals of the two multiplexers are carried in accordance with the number n=8 of quantizing (soft decision) stages in the A/D conversion, first to the exclusive OR gates (G1, G2, G3, G7, G8, G9) and second to exclusive NOR gates (G4, G5, G6, G10, G11, G12).

Input signals Q1 and Q2 are always split between multiplexers MX1 and MX2. Thus, if multiplexer MX1 has selected Q1, then multiplexer MX2 selects Q2 and vice versa.

The quantized variables Q1 and Q2 are thus available, each in both inverted and noninverted form. By means of adders ADD1–ADD4 connected to the output side, the four branch metrics R00, R10, R01 and R11 are available at the output of the transformation network for further processing in the ACS (add-compare-select) networks of the Viterbi decoder.

With each new input Q1 and Q2, the respective branch metrics at the adder outputs shift according to the values of C1 and C2. Suitable ACS networks are known to those in the profession; for example, see the Proceedings of the IEEE, Vol. 61, No. 3, March 1973, pages 268–277, in particular FIG. 10, page 273 along with the description. A particularly suitable ACS network is disclosed in the above U.S. Pat. No. 4,757,506. A particularly advantageous arrangement of ACS networks is illustrated in FIGS. 5–9 and described in detail below. This ACS network furnishes among others the maximum and minimum path metrics, the difference between which is obtained by mean of the DELTA-M stage (also described in the above U.S. Pat. No. 4,757,506). From this path metric difference, the phase error signal FAIL is now obtained, as will be described in further detail in connection with FIGS. 4a and 4b. It serves as the control signal for the phase ambiguity resolution stage, which generates the control bits C1 and C2 for the transformation network, or for furnishing a synchronizing signal SYNC, for instance if a punctured code is used.

The triggering of the transformation network can in principle be done in a plurality of ways. As an exemplary embodiment, QPSK modulation will be discussed. In that case there are four different possibilities of correct phase location, coded with the states 00, 11, 01, 10. To encompass them, two control bits C1 and C2 are required, C1 being the first digit, C2 being the second digit. In n-PSK signals, correspondingly more control bits are necessary.

If the carrier phase of the demodulator now jumps from one state to another, then an examination must be made as to whether the reaction of the decoder must take place in a pseudo-random manner, or in a manner determined in some way. In the method according to the prior art, this reaction was performed in a pseudo-random manner. In the invention, contrarily, the point of departure is the recognition that any demodulator system will inherently exhibit a preferential direction in phase jumps. As a consequence, the decoder is furnished thereby with an additional datum (the preferential direction), which it can use with appropriate processing to reduce the correction time. The triggering of the transformation network as a final control element is accordingly to take place by learning—what the preferential direction of phase jumps is—that is, adaptively. As will also be explained in connection with FIGS. 4a and 4b, the difference between the maximum and minimum path metric is evaluated, because it is a unique criterion for the current or prior-to-current quality of reception.

Figure 3:
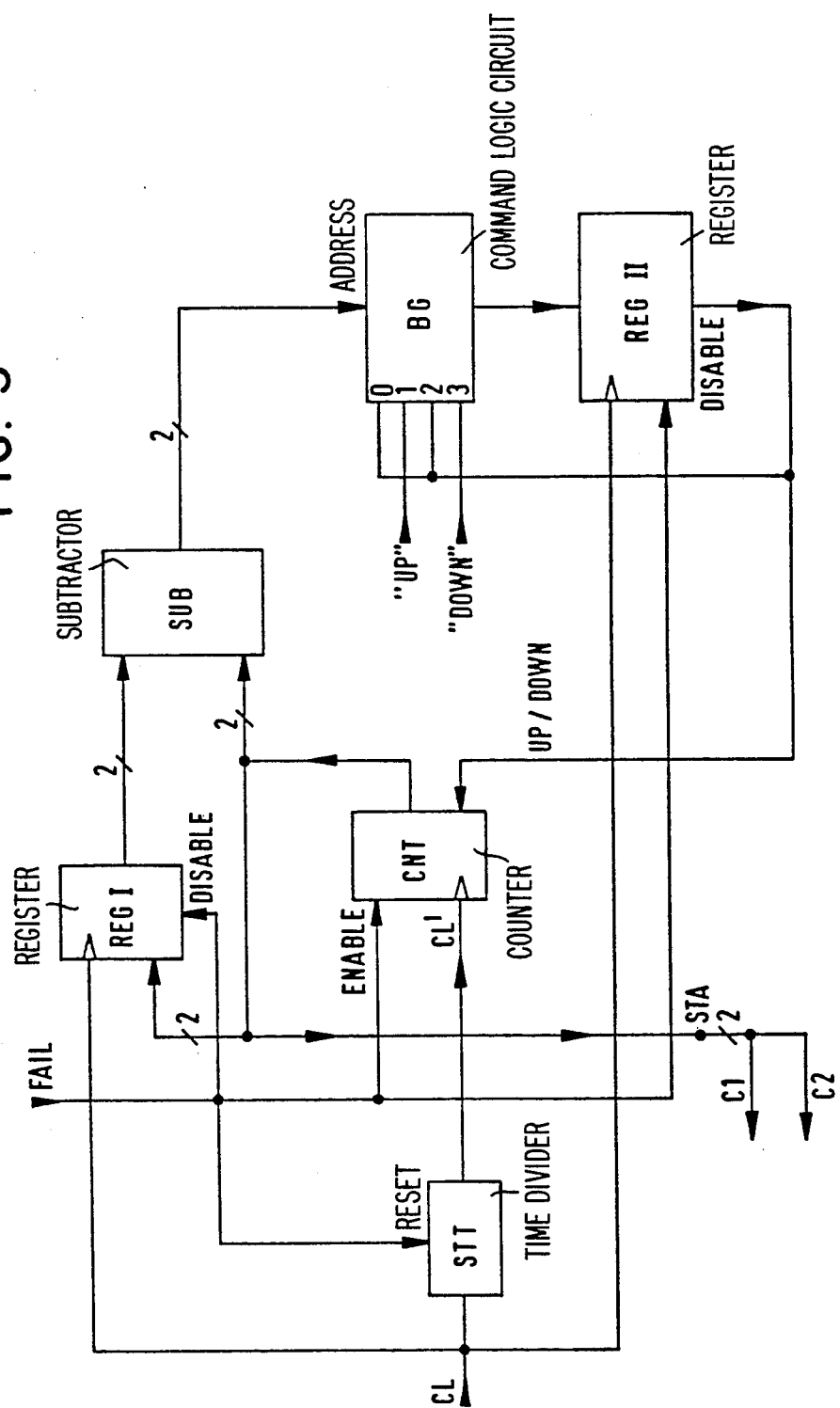
FIG. 3 is a circuit diagram of a circuit for phase ambiguity resolution in the Viterbi decoder of FIG. 1.

First, however, the phase ambiguity resolution stage will be discussed, which serves directly to trigger the final control element—i.e., the transformation network—and takes note of the preferential direction. Its circuit is shown in FIG. 3. The basic principle of adaptive triggering is to compare the new triggering state (the presence or absence of a FAIL signal) with the most recent, that is, the preceding triggering state and thereupon to effect a corresponding reaction. First, the counter CNT will be considered. Via its ENABLE input, it is made to count by a phase error signal FAIL, the generation of which will be explained in connection with FIGS. 4a and 4b; this counting is done at a speed that must be adapted to the recognition speed of the Viterbi decoder. Between the finding of the current phase state and the completion of calculation of the differential metric, a certain period of time elapses (the metric calculation time), and this must be waited out. For this reason, the counter CNT does not receive its counting pulses directly from the system clock signal CL of the Viterbi decoder, but rather via a system clock divider STT, which subdivides the system clock signal CL. This system clock divider STT takes into account the metric calculation time constant.

The frequency divider STT may be a commonly used frequency divider of cascaded flip-flops providing a clock signal CL', with a lower frequency than CL. The reason for this lower clock signal CL' being provided to counter CNT: if counter CNT does a counting step, the reaction time of the Viterbi decoder has to be waited for until the next counting step is admitted to appear. The clock signal CL on the other hand should be as high as possible, depending on digital circuitry available, to perform real-time processing. Frequency divider STT is reset in the case of a FAIL to avoid wasting time until the first step of the counter CNT. Therefore, frequency divider STT is reset via its RESET input.

The counter CNT now counts several clock signal pulses CL' (in binary) in accordance with the binary value, that are furnished to it by the output of the system clock signal-divider STT and passes its counter state on to a subtractor SUB. The counter state of counter CNT is also stored in the register REGI as a two-bit datum, that is, as one of four states. The previous counter state stored in the register REGI is compared with the current counter state by means of the subtractor SUB. This subtractor SUB determines the direction of a phase jump in the following manner: The result of comparison controls a command logic circuit BG via an address control input. At its four data inputs 0, 1, 2 and 3, in response to the binary inputs 0, 1, 2, and 3 from subtractor SUB, the command circuit BG receives a signal representing an "UP" instruction for counter CNT, e.g., a logic high value, or a "DOWN" instruction, e.g., a logic low value—input 1 or 3, respectively—or for maintaining the previous state—inputs 0 and 2—in the event of a phase jump difference of 180°. These possible designations are stored in command logic circuit BG, are output in response to the input from the subtractor SUB and may be overridden by the output of the register REGII. If circuit BG is a multiplexer, address controlled by its input signals (output signals of subtractor SUB), UP and DOWN states are stored in a ROM having two storage cells for logic high, e.g., UP state, and logic low, e.g., DOWN state.

In terms of circuitry, the command logic circuit BG can be realized by means of a multiplexer, as a function generator, or by means of a read-only memory or EPROM. The output datum of the command logic circuit BG reaches a register REGII, which cannot change its state if a FAIL signal is fed via its disable input. For this period of time (when there is a FAIL signal), the output datum of the register REGII furnishes the counter CNT, via its counting direction control input, with the information for counting upward or downward, UP/DOWN. The UP or DOWN state depends on whether the UP/DOWN input of counter CNT is high or low active, e.g., if counter CNT is driven into the down counting mode, the DOWN input of command logic circuit BG (multiplexer input 3) has to be set to logic low voltage and the UP input has to be set to logic high voltage. Both logic values are stored in circuit BG. The counter CNT only counts up or down if it is enabled by the FAIL signal. If the FAIL signal disappears, then the register REGII is re-updated with the next system clock signal pulse CL.

On the other hand, a reupdate also occurs in the register REGI, to which the FAIL signal is supplied via its DISABLE input, so that at the output of the subtractor SUB a 0 appears when the FAIL signal disappears. In the contents of the register REGII, however, this does not cause any error because the content of the register REGII is fed back to command logic circuit BG via its zero input. The function of the circuitry of FIG. 3 is shown in greater detail in FIG. 3a to be described below.

The other states at the data inputs of the command circuit BG are as follows: "UP" state for input 1, because then the counter state of the counter CNT has become greater than that of the register REG1, or in other words a future counting must be effected upward. When there is a FAIL signal, the register REGII is disabled to change its contents so that the old state is supplied to the input 2, because if, a 180° jump is involved, which can have arisen ambiguously, involving two values—that is, forwards or backwards, it is to be assumed that the error has occurred in the same direction as before (the old preferential direction is assumed). Thus, the output of register REGII overrides the 0 and 2 values of circuit BG which is an erasable memory. On the other hand, in the absense of a FAIL signal, register REGII is enabled so that the resultant zero input to command logic circuit BG is stored in register REGII so tha output of the latter will not override the zero value of circuit BG. Finally, the "DOWN" state corresponds to input 3, since in this case the counter state must be decreased by one as compared with the prior state. Then subtraction—or decrementing—should also take place in the future.

FIG. 3a shows the reaction of register REGI, counter CNT, subtractor SUB, command logic circuit BG and register REGII to the occurrence of a FAIL signal.

The output of counter CNT represents the control bits C1, C2 for the transformation network illustrated in FIG. 2. The control bits C1, C2 drive the inputs of this transformation network so the error in the demodulator bits Q1, Q2 is reversed by the correction represented by control bits C1, C2 and represent the reverse demodulation error.

In order that the circuit will exhibit the behavior described, the n-PSK signal is encoded in accordance with the invention in such a way that the binary value is in proportion to the phase angle. The association of the phase states for a Q-PSK modulation is as in the following Table I:

TABLE I

| Phase Angles | Binary States |
|---|---|
| 0° | 0 0 |
| 90° | 0 1 |
| 180° | 1 0 |
| 270°(equals −90°) | 1 1 |

The difference between two steps thus always equals 90°. Because the encoding of the individual phase states increases in binary fashion, the direction of the jump can be obtained by forming the difference between the old and new values.

In the case of an 8-PSK modulation, the encoding should be performed a in the following Table II:

TABLE II

| Phase Angles | Binary States |
|---|---|
| 0° | 0 0 0 |
| 45° | 0 0 1 |
| 90° | 0 1 0 |
| 135° | 0 1 1 |
| 180° | 1 0 0 |
| 225° | 1 0 1 |
| 270° | 1 1 0 |
| 315° | 1 1 1 |

The addresses of the command logic circuit BG are associated with these binary states. The command circuit BG then functions, for instance, as follows:

Phase jump direction>0→upward counting in the next phase jump;

Phase jump direction<0→downward counting in the next phase jump.

In a phase jump of 180° for 8-PSK, a well known ambiguity exists. In order to resolve it, the command circuit is equipped with a further address input, so that two different values are obtainable for 180°, for instance:

1 100 for 180° and the "UP" state
and 0 100 for 180° and "DOWN" state.

This would require additional imput addresses for circuit BG. The control signals C1 and C2 are available at the control signal output STA and represent the counter state of the counter CNT. The registers REGI and REGII are controlled by the system clock signal CL.

Figure 4A:
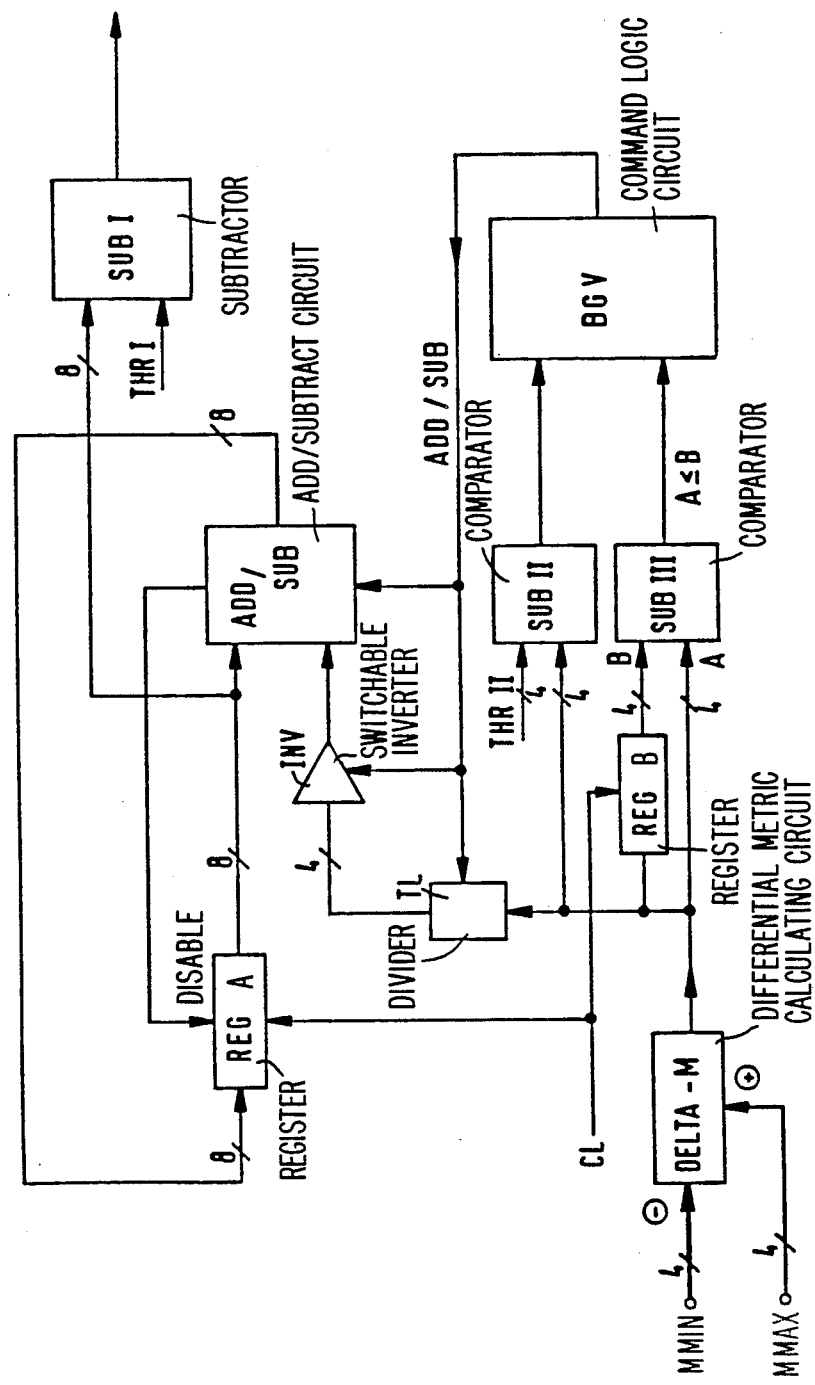
FIG. 4a is a circuit diagram of a first embodiment of the circuit for obtaining a phase error signal in the Viterbi decoder of FIG. 1.
Figure 4B:
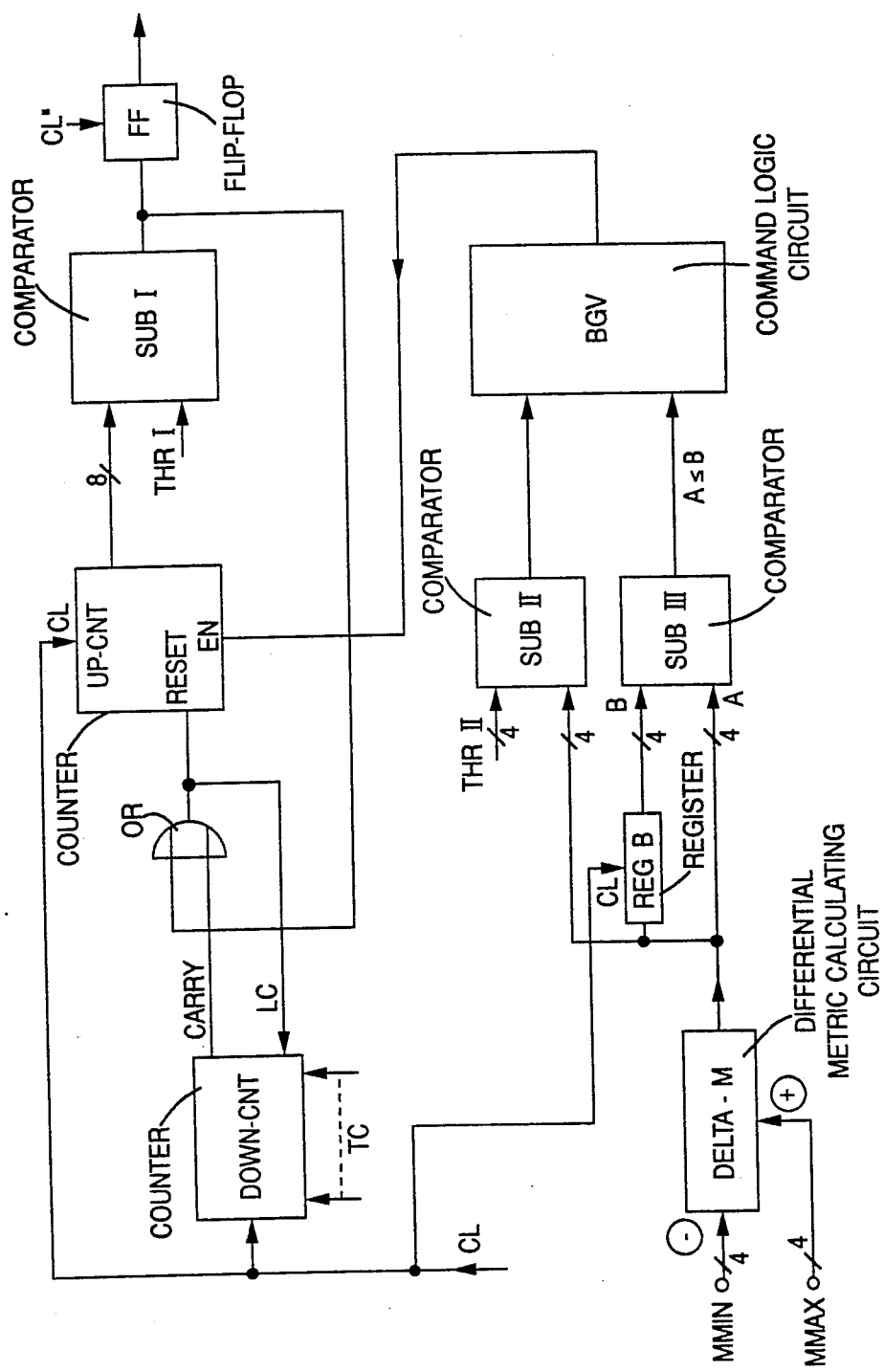
FIG. 4b is a circuit diagram of a second embodiment of the circuit for obtaining a phase error signal in the Viterbi decoder of FIG. 1.

FIGS. 4a and 4b illustrate alternate circuits for the generation of the phase error signal FAIL, that the phase ambiguity resolution stage of FIG. 3 is supplied with for phase ambiguity resolution.

However, before the generation of the phase error signal FAIL according to FIGS. 4a and 4b is explained, it should be explained why it is precisely the difference between the maximum and minimum path metric that is used for deriving the error signal. On the precondition that the minimum path metric can be extracted sufficiently quickly by means of the ACS network, an important criterion for evaluating the reception quality is available. Small path metrics characterize "good paths" in the Viterbi decoder used as a example. Conversely, large metrics characterize very improbable paths, and the maximum metric in particular is associated with the path that can be precluded under all circumstances.

This latter statement, however, precisely like that pertaining to the minimum metric, is an unequivocal evaluation of the reception quality, although indirectly indicated. This will readily be appreciated if it is considered that for the case of an absent reception signal (noise only), a total levelling of all the path metrics occurs; that is, the decoder no longer finds any relevant code at all and thus can no longer classify any states as to quality. Expressed numerically, all the metrics meet at a mean value; that is, in the case of the QPSK signals, where the metric is between 0 and 15, then they meet at approximately 7 or 8. Thus, the differential metric—which henceforth will also be called the delta metric and is calculated by a delta metric calculating circuit DELTA-M—becomes zero. In the best reception case, contrarily, it is 15. Accordingly, the delta metric encompasses the entire range of values defined for metrics, rather than only half of it, which would be the case if only the minimum or the maximum were utilized.

Path metrics are composed of a memory content and the branch metrics. Noise is expressed in the branch metrics as a deviation from the ideal value (from the metric without noise), which can be in the range from 0 to 14. More precisely, there are exactly three ideal values (assuming interference-free reception). These are, namely, 0 for the matching pattern, 14 for the opposite pattern, and 7 for the mixed pattern common to both. Once again, it is important to note that good reception quality is associated only with high unequivocality of the values, not merely with a minimizing of all the values.

This subject matter is decisive for recognizing phase error states. Such phase error states in fact cause the calculation of entirely invalid extreme-value branch metrics, which naturally are the more extreme the less noise is involved. Reference is made here to the following equations for calculating the branch metrics:

$R00 = Q1 + Q2$
$R01 = Q1 + 7 - Q2$
$R10 = 7 - Q1 + Q2$
$R11 = 7 - Q1 + 7 - Q2$

Q1 and Q2 here are the known soft decision values and range from 0 to 7.

Noise has the following influence:

Let it be assumed that the correct reception pattern is "01"; then Q1 must assume the value of 0, and Q2 the value of 7, while R01 becomes zero from the above equation. Thus, and with a minimum value, the metric of the optimal path is formed, which consequently assumes a minimum value.

Now let it be assumed that noise is fed to the channel. In that case, the statistical mean values continuously move over a plurality of bits, averaged for Q1, between 0 and 3.5 and for Q2 between 7 and 3.5. If this is entered with the extreme value (most noise) into the above equation, then for the maximum value that appears the following is obtained:

$R01 = 3.5 + 7 - 3.5 = 7$ (noise only)

and for the minimum value (least noise) that occurs, the following is obtained:

$R01 = 0 + 7 - 7 - = 0$ (freedom from interference).

This is the "deviation range" that occurs here, depending upon noise.

In the above discussion, the doubtlessly allowable assumption has been made that the values Q1 and Q2 converge with increasing noise toward a mean value of 3.5, one converging toward the value from below and the other from above. Now let it be assumed that a phase jump of +90° occurs. In that case, for the transposition and inversion already described, the following process occurs:

$Q1 \to Q2$ and $Q2 \to -Q1$.

These phase jumps are in accordance with and inherent in QPSK and 8PSK modulation deriving from the fact that Q1 and Q2 are different expressions of the same data, which is related in this manner.

The "new" Q1 now moves between 7 and 3.5 and the "new" Q2 moves between 7 and 3.5 because of the inversion. Then, with such a phase jump the metric R01 with and without noise is calculated as follows:

$R01 = 3.5 + 7 - 3.5 = 7$ (noise)
$R01 = 7 + 7 - 7 = 7$ (free of interference)

The result is interesting from the standpoint that R01 no longer comes under the "7" and thus indicates a "poor" situation. It should be noted here that the values move between 7 and 14 in the case of a 180° jump; that is, the situation becomes still more unequivocal. The situation is similar with the other phase states and branch metrics, as can easily be confirmed.

Now that it is clear that the entire metric movement reacts extremely sensitively to phase jumps, an evaluation of these events can be derived from this.

From the differential (delta) metric, substantially three variables are obtained.

(1) The temporal differential quotient, or only its algebraic sign (+ or −), that is the amount and/or direction of a change with time of the maximum metric minus the minimum metric (the differential metric), (2) the exceeding of a threshold as an alarm signal, (3) a time-related sum of numbers corresponding to a time integral of the differential metric, which represents a time constant until the attainment of a threshold, which then sets off the FAIL signal.

One point should be added about the last-mentioned variable above: It is intended to aid in preventing so called false alarms in the case of brief interference, the amplitude of which can still be high, however.

In a first realization of circuitry for obtaining the FAIL signal, (error signal calculating circuit) shown in FIG. 4a, the invention goes one step further: The increment and decrement of the time-related sum of numbers are intended not to be constant, but rather dependent on the current reception quality. Thus, depending on the interference situation, various contributions are obtained. Algorithmically, the definition should be such that in case of interference, incrementing is done with the complement of the delta metric (15-delta metric), but decrementing should be done with the delta metric itself. The reason for this is as follows: With initially good reception, the delta metric is high; that is, its complement is low. If the channel is very disturbed, all metrics have the same value. If a brief interference occurs, for instance the intrusion of noise, then incrementing is performed by calculating 15-delta metric, which has increased only a little; with a threshold set at a low level, a false alarm is not issued.

Contrarily, if a phase jump occurs, then as explained the complement increases sharply, because the delta metric itself becomes very small. Thus, the threshold is attained very quickly, which causes setting of the FAIL signal. The resynchronization time (the time to obtain a reliable metric decision), however, should be shortened to correct phase errors quickly. Therefore to achieve this, the decrement in the time related sum is effected with a DELTA-M stage which is greater when a phase error or jump occurs, and not earlier, such as if an apparently correct code is mistakenly produced because of an interference burst. Upon actual resynchronization, the decrement takes place quickly, contrarily, because the delta metric builds up anew.

According to FIGS. 4a, the difference between the minimum and maximum path metric—that is, the delta metric is formed by subtraction in the stage DELTA-M. The output of the stage DELTA-M is connected via a switchable inverter INV, for instance an exclusive OR gate, with the first data input of a switchable adder/subtractor ADD/SUB. The inverter INV, when enabled functions with stage DELTA-M to effectively calculate 15-delta metric. Optionally, a divider TL is also disposed before the inverter INV, for example comprising a multiplier with a switchable dividing ratio. A second data input of the switchable adder/subtractor is connected to the output of a first register REG A. The output value of the adder/subtractor ADD/SUB is applied to the data input of this register REG A. The adder/subtractor ADD/SUB has a control input by way of which a signal can be supplied that determines whether addition or subtraction is to be performed. The adder/subtractor ADD/SUB, together with the register REG A, functions as a so-called random walk counter with an arbitrary increment/decrement It is supplied with this increment in the decrement form of a delta metric via the switchable inverter INV. The overflow or "carry" of the adder/subtractor ADD/SUB is supplied to the register REG A via its DISABLE input. The output of the first register REG A is input to a subtractor SUBI, which compares it with a threshold value THRI. The process takes place over a width of eight bits, for example, in order to attain a wide range for the threshold value setting. The sum formation can also make this range necessary.

The command to add/subtract is rigidly coupled to the INVERT/NON-INVERT command for the inverter INV; that is, it is incremented with the complement of the delta metric 15-delta metric and decremented with the delta metric itself; the delta metric can be valuated with variable factors by divider TL.

This command is derived in turn from the aforementioned conditions (1) and (2); that is, the delta metric itself is first compared with a threshold THRII, with the aid of a subtractor SUBII. Furthermore, a formation of the algebraic sign (+ or −) of the temporal differential quotient is effected with the aid of a second register REG B and a further subtractor SUBIII, in such a manner that the old delta metric value is subtracted from the new one, and the result leaves the subtractor SUBIII via the carry. Both results reach a command logic circuit BGV.

This logic device, from among the four possible combinations for the algebraic signs of the differential quotient and the carry signal, furnishes at its output a command, as to whether adding or subtracting in the ADD/SUB circuit, and inversion or non-inversion in the INV circuit, are to be performed. An inversion here corresponds to an addition by adder/subtractor ADD/SUB and a non-inversion corresponds to a subtraction by adder/subsractor ADD/SUB. One possible set of commands of circuit BGV is shown in the following truth table, Table III:

TABLE III

| OUTPUT OF SUBIII | OUTPUT OF SUBII | OUTPUT OF BGV |
|---|---|---|
| 0 | 0 | LOW (substract) |
| <0 | 0 | HIGH (add) |
| 0 | <0 | HIGH (add) |
| <0 | <0 | HIGH (add) |

In this example, adding is performed if one of these conditions will lead to a false signal; otherwise, subtraction is performed. The command circuit logic BGV may be implemented in the form of an EPROM or of a multiplexer as a function generator, depending upon the speed required.

The command signal output by the command circuit logic BGV is delivered to the control input of the switchable adder/subtractor ADD/SUB, the control input of the switchable inverter INV, and optionally to a control input of the divider TL.

The registers REG A and REG B are controlled by a common system clock signal CL to repectively input the data from adder/subtractor ADD/SUB and the DELTA-M stage.

In FIG. 4b there is shown a second realization of an error signal calculating circuit. In this circuit, as in the circuit of FIG. 4a, the delta metric MMAX-MMIN calculated by a DELTA-M stage, is fed to two subtractor stages SUBII and SUBIII. Subtractor stage SUBII compares the delta metric with a threshold THRII. In addition, like the error signal calculating circuit of FIG. 4a, a temporary differential quotient signal is formed with the help of a register REG B and a further subtractor SUBIII in such a way that the old metric value is subtracted from the new one and the result leaves the subtractor SUBII over the carry.

Figure 4C:
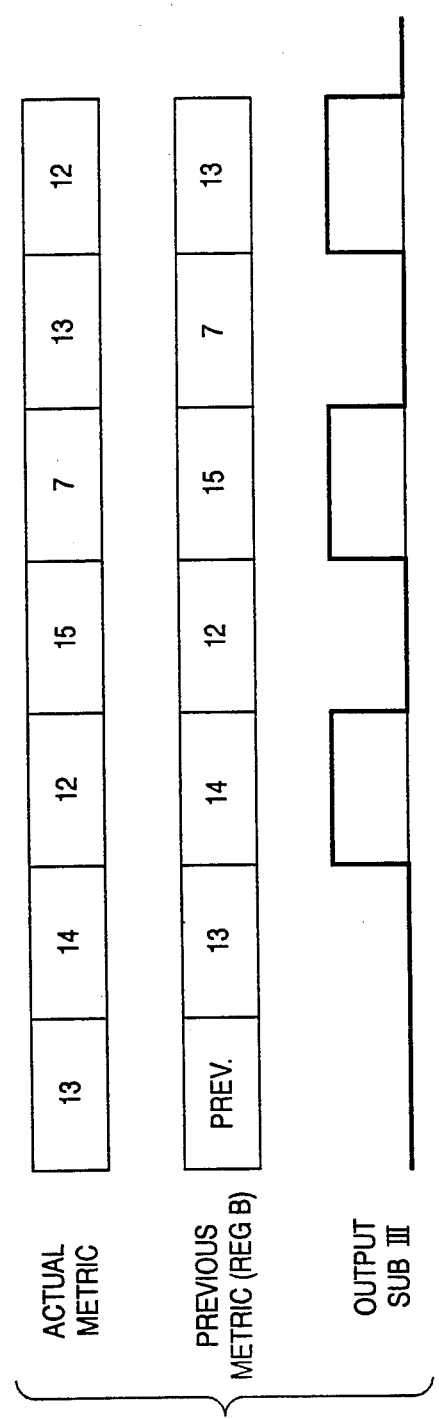
FIG. 4c shows the formation of the temporary differential quotient and its sign.

FIG. 4c shows a numerical example of the formation of the temporary differential quotient and the evaluation of its sign (output of subtractor SUBIII). The actual metric values are shown in the first line of FIG. 4c, and the previous ones in the second line.

Both results reach logic command circuit BGV. As in the circuitry shown in FIG. 4a, the command logic circuit BGV can be realized by a known state of the art EPROM with the truth table shown in Table IV below.

TABLE IV

| OUTPUT OF SUBIII | OUTPUT OF SUBII | OUTPUT OF BGV |
|---|---|---|
| 0 | $\geq 0$ | LOW |
| <0 | 0 | HIGH |
| 0 | <0 | HIGH |
| <0 | <0 | HIGH |

The output signal of circuit BGV is fed to the ENABLE input of an up counter UP-CNT. Short time pulses delivered by circuit BGV represent an error signal for those cases where the threshold conditions fixed by the truth table of circuit BGV are violated (High levels). These short time pulses have to be counted for a reasonable time (considering the fact that changes due to noise and lasting only a short time are to be suppressed) and compared with a threshold THRI with the aid of subtractor stage SUBI. This "integrate and dump" processing is done by an up counter UP-CNT, a down counter DOWN-CNT and an OR stage. A minimum time of counting by counter UP-CNT is established by the threshold THRI. A maximum time period on time for counting TC is established whereby a FAIL signal will be output only if the count of the counter UP-CNT reaches threshold THRI within the time period TC. The maximum time for counting is set by down counter DOWN-CNT, which is fed with the counting time constant TC via its load inputs. A load command LC to perform the parallel load of the time constant TC is represented by the output of an OR gate whose inputs are a zero input from the carry output of counter DOWN-CNT and the output of subtractor stage SUBI. Both counters and register REG B are clocked by clock signal CL. Down counter DOWN-CNT begins to count down until 0. If down counter DOWN-CNT has reached 0 before up counter UP-CNT reaches the threshold THRI, subtractor stage SUBI will not output a FAIL signal. Up counter UP-CNT is reset and down counter DOWN-CNT is loaded again with the counting time constant TC in response to the load command LC. If up counter UP-CNT has reached threshold THRI before down counter DOWN-CNT reaches 0 a FAIL signal at the output of subtractor stage SUBI will appear, which is fed to the phase ambiguity resolution stage (see FIG. 3) via a flip flop FF, which is clocked by clock signal CL", being slower than either clock signal CL or clock signal CL'. The reason that clock signal CL" is made slower is that the FAIL signal has to be held for the time of further processing performed by the phase ambiguity stage.

The FAIL signal must be stable and must not pulse during an incorrect counterstate. Therefore, the relationship between the time constant TC and the threshold THRI is chosen as described above. A FAIL signal may not correct a false demodulator phase ambiguity state. Time constant TC is an integration time constant to distinguish properly between metric errors due to channel noise and synchronization errors.

In the case of expected phase jumps in accordance with QPSK or n-PSK signal modulation, the threshold THRI is reached very fast, consequently producing a FAIL signal. Error bursts, which simulate apparently correct codes are neglected.

An improved ACS circuit which calculates the maximum and minimum metrics MMAX and MMIN input to the differential metric stage DELTA-M shown in FIGS. 1, 4a and 4b, is shown in detail FIGS. 5-9. In the fundamental circuit diagram of FIG. 6, two of a total of 16 ACS networks are shown, each of which compares the effect of one of 16 possible transitions between 4-bit numbers in a shift register when a most significant bit is released and a least significant bit is added. In each of these ACS networks, this is accomplished by adding respective opposed branch metrics to one of two previously ascertained metric data. The respective two results of addition are compared with one another. The results of comparison from all of the ACS networks are then collected and evaluated in terms of extreme-value metrics.

From the metric datum MSEL (MSEL1, MSEL2, ...) obtained by means of each of the ACS stages ACS0, ACS1, ..., the extreme-value metric obtained from the collected results of comparison—in this case the minimum metric MMIN—is subtracted in a subtraction stage SUB0, SUB1, .... A respective memory ST0, ST1, ... associated with each ACS network is updated with the result of the subtraction, its memory contents being available as the "previously ascertained metric data" for the next addition.

Figure 6:
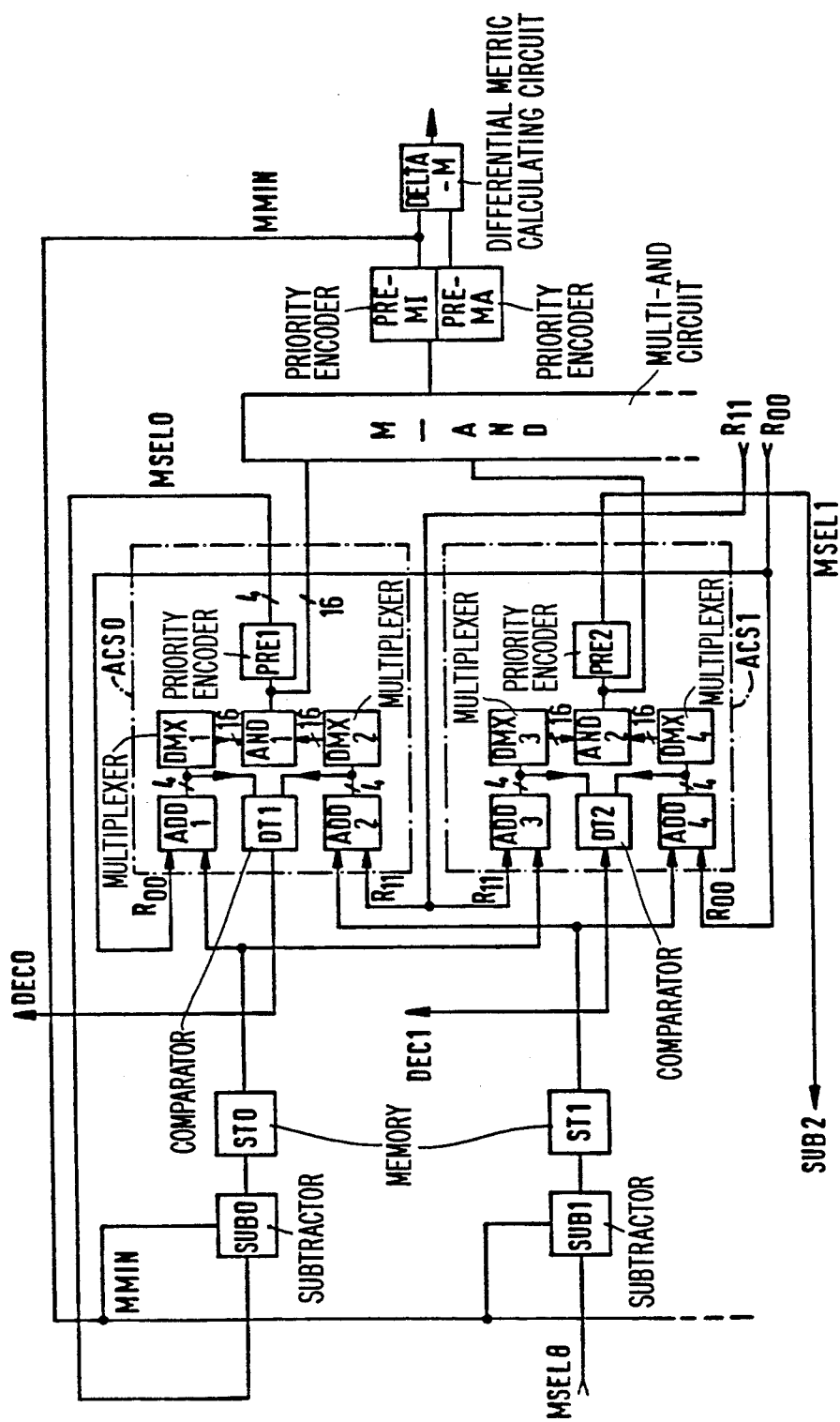
FIG. 6 is a detailed circuit diagram illustrating two of sixteen connected ACS networks of FIG. 5, to show the principle of metric evaluation in accordance with the invention.

As FIG. 6 shows, in the first ACS network ACS0, the particular current branch metric R00 is added by means of a first adder ADD1, to the contents of the memory ST0. By means of a second adder ADD2, the particular current branch metric opposed to R00, that is, R11, is added to the contents of the memory ST1 associated with the next ACS network ACS1. The additions are performed in the arithmetic domain, that is, with conventional 4-bit binary adders. By means of transformation stages, the two 4-bit-wide arithmetic output data of the adders ADD1 and ADD2 are transformed into the logical domain. This transformation can for example be attained by means of multiplexers DMX1, DMX2, ..., which convert the 4-bit-wide binary number into a $2^4$-wide binary stream, in which the binary number is identified as a bit position, for example as a logical zero state among solely logical one states, or as a logical one state among solely logical zero states.

Figure 7:
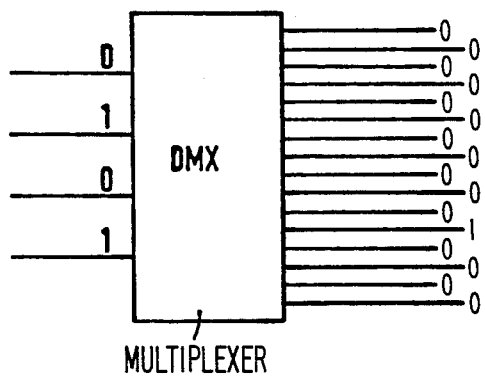
FIG. 7 illustrates a transformation from the arithmetic to the logical domain with the DMX circuits of FIG. 6.
Figure 8:
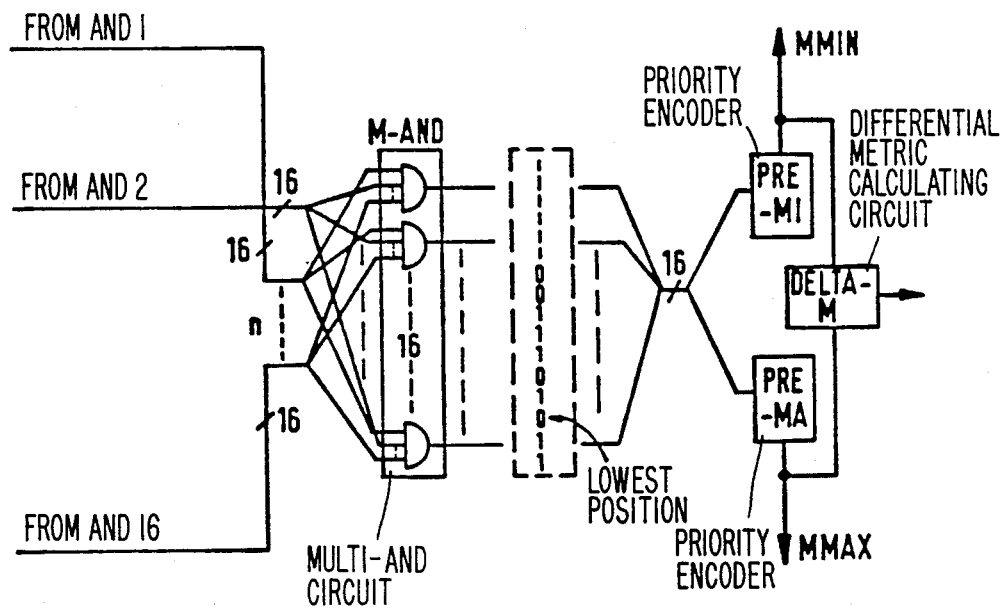
FIG. 8 illustrates the structure of a multi-AND linking stage of FIGS. 5 and 6.

FIG. 7 schematically illustrates such a transformation. In each respective logical comparison stage, AND1, AND2, ..., the two logically transformed addition results of each ACS network are compared with one another. This comparison is effected in the logical domain, bit by bit, by means of an AND linkage. At the output of each comparison stage AND1, AND2, ..., a 16-bit-wide binary stream then reappears, characterized by the bit position. The results of all of the comparison stages AND1, AND2, ... are collected in the logical domain by means of a multi-AND linking stage M-AND. The structure of this linking stage M-AND is shown schematically in FIG. 8 and can be realized by a wired AND structure using diodes and resistors in a conventional manner or by cascading usual AND arrays. At the output of the multi-AND linking stage, two priority encoders PRE-MA and PRE-MI are provided. The priority encoder PRE-MI localizes the least significant bit position, and emits it in the form of a binary number, that is, arithmetically, in the form of a minimum metric—path metric—MMIN. The priority encoder PRE-MA localizes the most significant bit position and makes the maximum metric MMAX available. From the minimum and maximum metric, the differential metric is formed by subtraction in the stage Delta-M. The differential metric ascertained is required for instance for synchronization or for phase ambiguity resolution in Viterbi decoding as will be described below.

Figure 5:
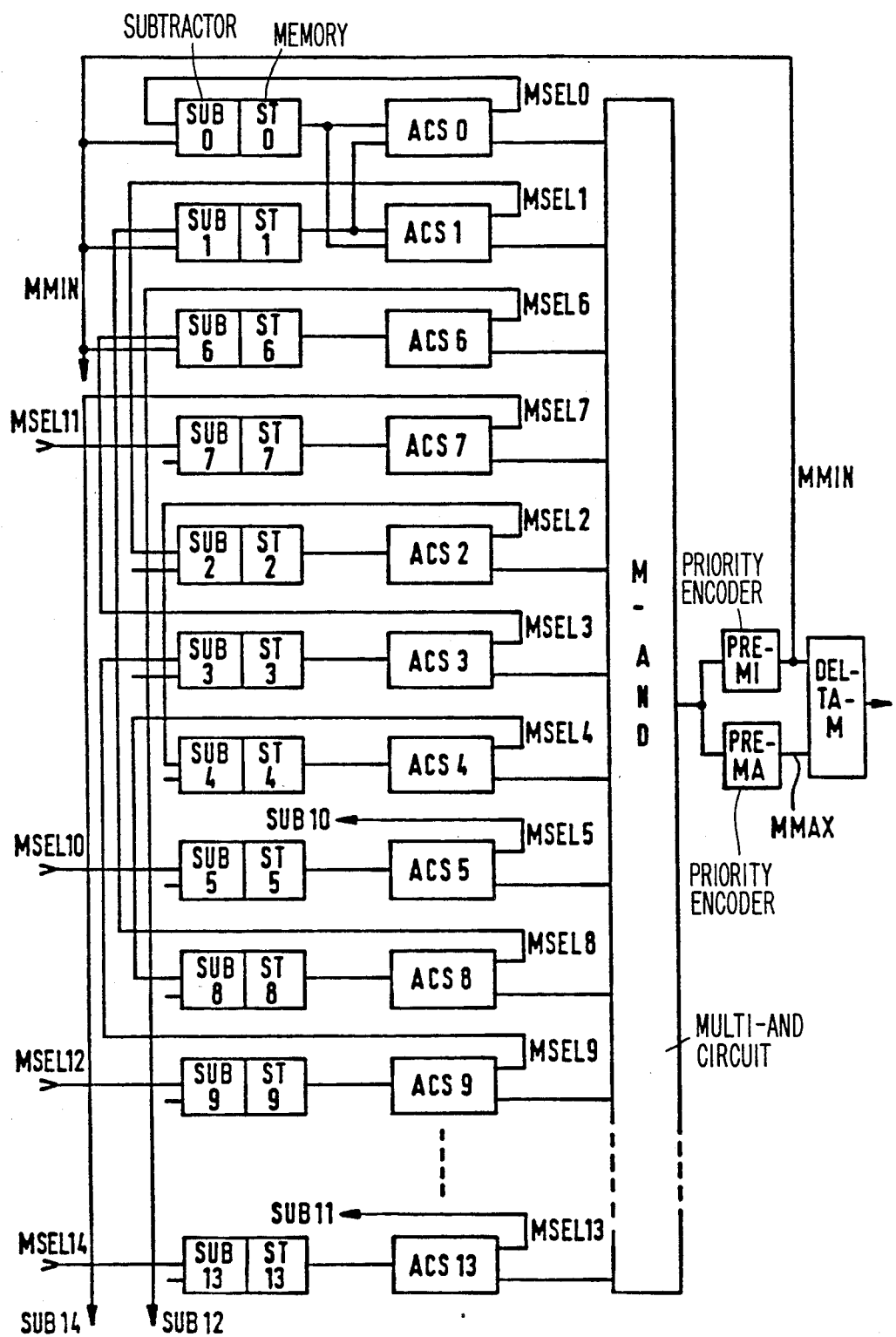
FIG. 5 is an overall circuit diagram showing all the ACS networks in the Viterbi decoder of FIG. 1.
Figure 9:
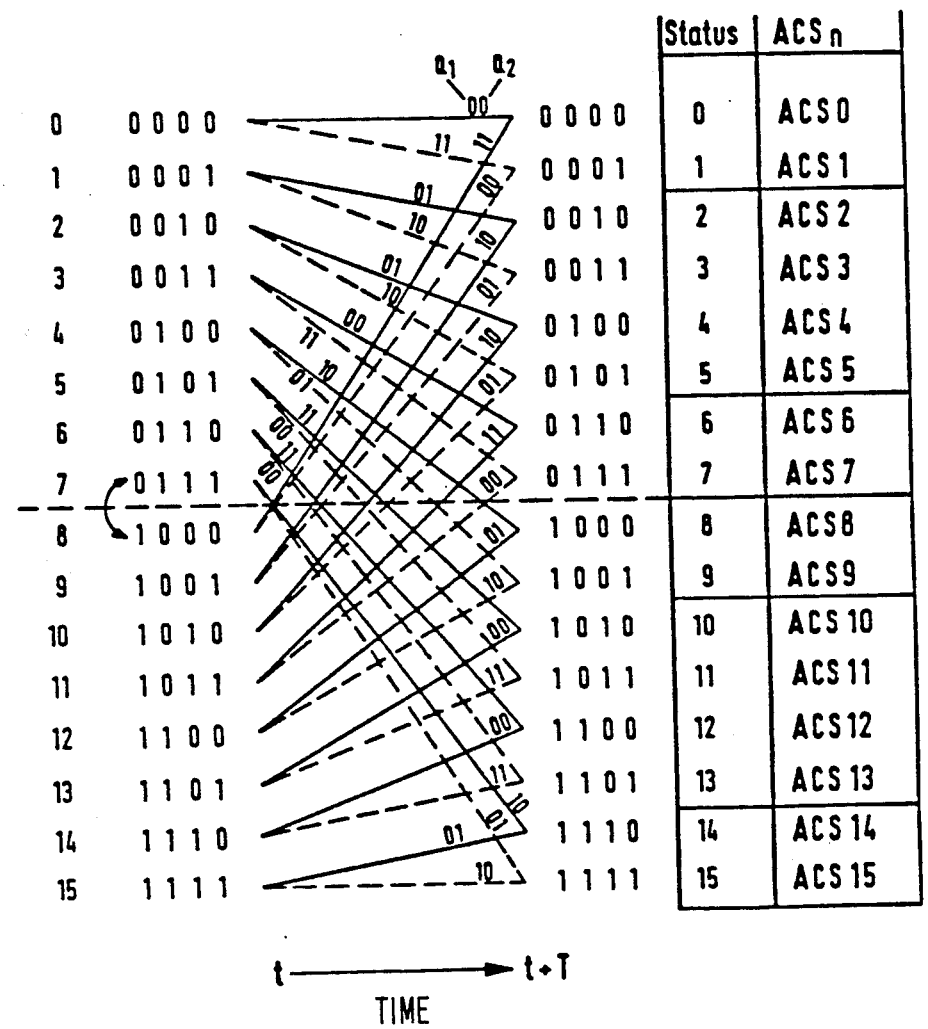
FIG. 9 is a trellis diagram for the ACS networks shown in FIG. 5.

The output of each logical comparison stage AND1, AND2, ... of one ACS network is connected to a priority encoder PRE1, PRE2, ..., which selects the extreme value bit position—in the exemplary embodiment the least significant bit position—from each comparison result and emits it in the form of a binary number in the arithmetical operation domain. This binary number is emitted in the form of the metric datum MSEL to one of the subtractors SUB0, SUB1, ... associated with the ACS stages, with 4-bit-wide processing, for subtraction of the minimum metric MMIN and updating of the respective memory ST0, ST1, .... The memories ST0, ST1, ... must receive only 4-bit-wide words, because the subtractors connected to their input side and the adders connected to their output side operate in the arithmetical operation domain. Which metric datum of an ACS network is carried to which one of the subtractors depends upon the trellis diagram for the ACS networks which shows all of the possible transitions; this is sufficiently familiar from the literature. The trellis diagram is shown in FIG. 9 for a possible Viterbi decoding. See also FIG. 1 of U.S. Pat. No. 4,757,506 showing the same trellis diagram and the accompanying description. It shows on the basis of which transitions new source bits Q1 and Q2 can be produced and the postscripts of the branch metrics R00, R01, R10, R11 associated with each transition. Thus, the output of the priority encoder PRE of the ith ACS network ACSi (i=0, ..., 15) as identified in the left had column in FIG. 9 is input to the subtractor SUBj associated with the jth ACS network ACSj (j=0, ..., 15) as identified in the right hand column in FIG. 9 connected therewith by a solid line for the outputs of encoders PRE of the 0th through 7th ACS networks and by a dashed line for the outputs of encoders PRE of the 8th through 15th ACS networks. For example, the metric datum MSEL0 obtained by means of the network ACS0 is carried to the subtractor SUB0, but the metric datum MSEL1 obtained by means of the network ACS1 is carried to the subtractor SUB2, which is associated with the network ACS2; and the subtractor SUB1 associated with the network ACS1 receives the metric datum MSEL8 of the network ACS8. Furthermore, the output of each memory STj associated with the ACS network ACSj is input to one of the adders of the assocated ACS network ACSj and to the other adder of a ACS network with which it is paired, the pairings being indicated in FIG. 8 by those ACS networks listed in the right hand column which are coupled by dashed and solid line to the same ACS networks listed in the left hand column. Thus, ACS0 and ACS1, ACS2 and ACS3, ACS4 and ACS5, ACS6 and ACS7, ACS8 and ACS9, ACS10 and ACS11, ACS12 and ACS13, ACS14 and ACS15 are respectively paired in accordance with this trellis diagram. FIG. 5 shows the connecting routes between most of the 16 ACS networks.

Each ACS network includes still another stage, which has not yet been discussed. This involves comparators DT1, DT2, ..., each for obtaining one path decision datum DEC0, DEC1, ..., which may be required for some types of further Viterbi decoding.

The comparators DT1, DT2, ... each compare the respective addition results of the two adders ADD1, ADD2, ... prior to the transformation into the logical domain in each ACS network in the arithmetical operation domain, that is, with respect to 4-bit-wide words. Whether the difference between the two addition results is equal to 8 or less than 8 is in each case emitted as path decision data.

The present disclosure relates to the subject matter disclosed in Federal Republic of Germany patent applications No. P 37 25 655.6 filed Aug. 3rd, 1987, No. 37 24 536.8 filed July 24th, 1987, P 37 24 537.6 filed July 24, 1987, the entire specification of which is incorporated herein by reference.

It will be understood that the above description of the present invention is susceptible to various modifications, changes and adaptations, and the same are intended to be comprehended within the meaning and range of equivalents of the appended claims.

What is claimed is:

1. A method for obtaining control signals representing an estimated phase error in a demodulated n-PSK signal for use in resolving phase ambiguities, comprising the steps of:
    encoding the n-PSK signal so to have a value proportional to a phase angle;
    ascertaining a jump direction of the phase angle by determining the difference between successive values of the encoded n-PSK signal;
    counting upward on a binary counter whenever the ascertained jump direction is positive;
    counting downward on the binary counter whenever the ascertained jump direction is negative; and
    emitting the state of the counter in the form of a control signal, the control signal representing the estimated phase error.

2. A method as in claim 1, further comprising the step of controlling the counter with a phase error signal indicative of the existance of a phase error, said step of controlling including the step of enabling the counter to count in response to detection of the phase error signal and disabling the counter from counting in response to disappearance of the phase error signal.

3. A method as in claim 1, further comprising the steps of applying the control signals and demodulated n-PSK signal having phase ambiguities appearing at a carrier recovery of a demodulator, to a transformation network at a digital input of a convolution decoder and controlling the transformation network with the control signals to cancel the phase ambiguity.

4. An apparatus for obtaining control signals representing an estimated phase error in a demodulated n-PSK signal encoded so as to have values proportional to a phase angle, for use in resolving phase ambiguities, comprising:
  means for ascertaining a jump direction of the phase angle by determining the difference between successive values of the encoded n-PSK signal, including
    a binary counter having an enable input responsive to a phase error signal indicative of the presence of a phase error in the encoded n-PSK signal to enable the counter to count, and responsive to disappearance of the phase error signal to disable the counter to count,
    a counting direction control input and a clock input, for receiving clock signals to be counted by said counter, and
    an output for emitting a count indicative of the state of the counter, in the form of a control signal representing the estimated phase error;
  a first memory having a data input coupled to the output of the counter for receiving the count of the counter and a first disable input, and storing the count of the counter only in the absence of the phase error signal at said first disable input, said first memory further having an output for outputting the count stored therein;
  a subtractor having a first data input coupled to the output of said counter and a second data input coupled to the output of said first memory, for subtracting the count stored in the first memory from the count output from the counter to produce an output corresponding to an estimated phase jump;
  a command logic circuit having:
    an address control input coupled to the subtractor for receiving the output of the subtractor, and
    means, responsive to an output from the subtractor corresponding to various estimated phase jumps, for outputting a down signal when the estimated phase jump is more than 180 degrees, for outputting an up signal when the estimated phase jump is less than 180 degrees and for outputting the most recently output signal when the estimated phase jump is equal to 180 degrees; and
  a second memory having
    a data input coupled to the command logic circuit for receiving the output signals of the command logic circuit,
    a second disable input,
    means for storing the output signals input from the command logic circuit to the data input, only in the absence of the phase error signal at the second disable input,
    a data output coupled to the counting direction control input of the counter for providing the output signals from the command logic circuit stored in said second memory, to said counting direction control input, said counter being responsive to said up signal to count up and being responsive to said down signal to count down.

5. An apparatus as in claim 4, further comprising a system cock divider for dividing the clock signals, having an enable input and being responsive to the phase error signal at said enable input for outputting a divided signal, said divider being coupled to said clock input of said counter so that said counter counts the divided clock signals input at said clock input.

6. An apparatus as in claim 5, wherein said command logic circuit is a multiplexer operational as a function generator.

7. An apparatus as in claim 5, wherein said command logic circuit is a read-only memory.

8. An apparatus as in claim 5, further comprising a convolutional decoder having a digital input, a transformation network having an output coupled to said digital input, demodulator means for providing a demodulated n-PSK signal, having its output coupled to said transformation network and means for applying said control signals to said transformation network to control said transformation network to cancel the phase ambiguity in said demodulated n-PSK signals.

9. A method for obtaining an error signal representing a phase error, which includes information on the quality of a convolution code signal, comprising the steps of:
  forming a differential metric based on the difference between a minimum and a maximum path metric of the convolution code signal;
  determining whether the differential metric exceeds a first threshold value and an algebraic sign of a change in the differential metric;
  producing a first error signal each time the differential metric is below the first threshold value or the algebraic sign of the change in the differential metric is negative;
  counting the first error signals for a predetermined continuous period of time; and
  producing a second error signal representing a determination of a phase error if a predetermined number of the first error signals are counted during the predetermined continuous period of time.

10. An apparatus for obtaining an error signal representing a phase error in a demodulated convolution code signal, which includes information on the quality of the convolution code signal, comprising:
  .a differential metric means for forming a differential metric based on the difference between a minimum and a maximum path metric of the convolution code signal;
  first comparison means, coupled to an output of said differential metric means, for determining whether the differential metric exceeds a first threshold value;
  second comparison means for determining the algebraic sign of a change in the differential metric;
  command logic means, coupled to the outputs of the first and second comparison means, for producing a first error signal each time the differential metric is below the first threshold value or the algebraic sign of the change in the differential metric is negative;
  first counting means, coupled to the output of said command logic means, for counting the first error signals for a predetermined continuous period of time; and
  third comparison means, coupled to the output of said first counting means, for producing a second error signal representing a determination of a phase error if a predetermined number of the first error signals are counted during the predetermined continuous period of time.

11. An apparatus as in claim 10, further comprising means for timing the predetermined period of time, wherein said second comparison means includes a register, coupled to the output of the differential metric means for storing a prior differential metric value, and a first comparator having a first input coupled to the output of the register and a second input coupled to the output of the differential metric means; said counting means having a first reset coupled to the output of said third comparison means and to the output of said means for timing, for resetting said counting means in response to said second error signal and for resetting said counting means in response to timing out of said timing means.

12. An apparatus as in claim 11, further comprising an OR gate having first and second inputs respectively coupled to the output of said third comparison means and the output of the timing means, and having an output coupled to said first reset, said timing means having a second reset coupled to the output of said OR gate.

13. A method of evaluating branch metrics while decoding convolutional code digital signals, the method comprising the steps of:
for each of a plurality of memories and the respective pairs of branch metrics, adding in an arithmetic domain a respective current branch metric one at a time to a current value stored in a corresponding one of the memories to obtain a corresponding decision, respective pairs of the branch metrics comprising two opposed ones of the branch metrics;
transforming the decisions from the arithmetic domain to a logical domain;
comparing in the logical domain the transformed decisions of respective pairs of the transformed decisions deriving from the additions of the branch metrics of the respective pairs of opposed branch metrics to the current values, said step of comparing including the step of determining one of a least significant bit position and a most significant bit position at which the compared transformed decisions differ;
selecting the minimum metric for each of the respective pairs of transformed decisions, the minimum metric being represented in the logical domain by the one of the least significant bit position and the most significant bit position determined from each comparison of the transformed decisions during said step of comparing the transformed decisions of respective pairs of the transformed decisions;
collecting the minimum metrics selected during said step of selecting the minimum metric for each of the respective pairs of transformed decisions;
selecting an overall minimum metric from among the minimum metrics collected during said step of collecting;
subtracting the overall minimum metric from each of the minimum metrics selected during said step of selecting the minimum metrics for each of the respective pairs of transformed decisions; and
updating the current stored values stored in the memories with respective ones of the results of the subtraction performed during said step of subtracting the overall minimum metric from each of the minimum metrics.

14. A method as in claim 13, further comprising the steps of comparing the decisions obtained in said step of adding in the arithmetic domain, of respective pairs of decisions deriving from the additions performed with respect to the branch metrics of the respective pairs of opposed branch metrics, to obtain a path decision datum for each of the respective pairs of decisions.

15. A method as in claim 13, further comprising the steps of:
selecting the least significant bit position and the most significant bit position from the collected results collected during said step of collecting;
subtracting the least significant bit position from the most significant bit position to obtain a path metric difference; and
emitting the path metric difference obtained during said step of subtracting the least significant bit position from the most significant bit position.

16. An apparatus for evaluating branch metrics while decoding convolutional code digital signals, comprising:
a plurality of memories;
a plurality of first adding means, each first adding means being respectively associated with a respective one of said memories and including means for adding in the arithmetic domain a respective current branch metric at a time to a current value stored in said corresponding one of the memories to obtain a corresponding decision, wherein respective pairs of the branch metrics comprise two opposed ones of the branch metrics;
means for transforming the decisions from the arithmetic domain to the logical domain;
first comparing means for comparing in the logical domain, the transformed decisions of respective pairs of the transformed decisions deriving from respective pairs of opposed branch metrics, to obtain one of a least significant bit position and a most significant bit position at which the transformed decisions differ;
means for selecting the minimum metric for each of the respective pairs of transformed decisions, the minimum metric being one of the least significant bit position and the most significant bit position determined from each comparison of the transformed decisions by said means for comparing the transformed decisions of respective pairs of the transformed decisions;
means for collecting the minimum metrics selected by said means for selecting the minimum metric for each of the respective pairs of transformed decisions;
means for selecting an overall minimum metric from among the minimum metrics collected by said means for collecting;
means for subtracting the overall minimum metric from each of the minimum metrics selected by said means for selecting the minimum metric for each of the respective pairs of transformed decisions; and
means for updating the value stored in the memories with respective ones of the results of the subtraction performed by said means for subtracting the overall minimum metric from each of the minimum metric.

17. An apparatus as in claim 16, further comprising second comparing means for comparing the decisions obtained by said means for adding in the arithmetic domain, of respective pairs of the decisions deriving from the additions performed with respect to the branch metrics of the respective pairs of opposed branch metrics, to obtain a path decision datum for each of the respective pairs of decisions.

18. An apparatus as in claim 17, wherein said means for transforming the decisions from the arithmetic domain to the logical domain includes a multiplexer, said first comparing means including AND linking stages, said means for selecting the minimum metric for each of the respective pairs of transformed decisions including a plurality of first priority encoders, said means for collecting the minimum metrics including a multi-AND-stage, said means for selecting the overall minimum metric from among the minimum metrics collected by said means for collecting including a second priority encoder, said means for updating the the values in the memories coupling said subtracting means to respective ones of said memories, and said second comparing means including threshold value detectors.

* * * * *